United States Patent
Negoro

(10) Patent No.: US 8,558,372 B2
(45) Date of Patent: Oct. 15, 2013

(54) SEMICONDUCTOR DEVICE

(75) Inventor: Syuji Negoro, Nagano (JP)

(73) Assignee: Shinko Electric Industry Co., Ltd., Nagano-ken (JP)

( * ) Notice: Subject to any disclaimer, the term of this patent is extended or adjusted under 35 U.S.C. 154(b) by 0 days.

(21) Appl. No.: 13/584,022

(22) Filed: Aug. 13, 2012

(65) Prior Publication Data

US 2013/0043581 A1    Feb. 21, 2013

(30) Foreign Application Priority Data

Aug. 18, 2011    (JP) ................. 2011-178933

(51) Int. Cl.
*H01L 23/10*    (2006.01)
*H01L 23/34*    (2006.01)

(52) U.S. Cl.
USPC .......................... 257/707; 257/706

(58) Field of Classification Search
USPC ............... 257/704, 706, 707, 723, 724, 778
See application file for complete search history.

(56) References Cited

U.S. PATENT DOCUMENTS

| | | | | |
|---|---|---|---|---|
| 5,548,482 | A | * | 8/1996 | Hatauchi et al. ............... 361/720 |
| 6,275,381 | B1 | * | 8/2001 | Edwards et al. ............... 361/717 |
| 6,888,722 | B2 | * | 5/2005 | Viswanath .................... 361/704 |
| 7,031,162 | B2 | * | 4/2006 | Arvelo et al. ................. 361/718 |
| 7,133,705 | B2 | * | 11/2006 | Akatsuka et al. .......... 455/575.1 |
| 7,995,344 | B2 | * | 8/2011 | Dando et al. .................. 361/710 |
| 2004/0099944 | A1 | * | 5/2004 | Kimura ......................... 257/706 |

FOREIGN PATENT DOCUMENTS

| | | |
|---|---|---|
| JP | 2004-172489 | 6/2004 |
| JP | 2009-043978 | 2/2009 |

* cited by examiner

*Primary Examiner* — S. V. Clark
(74) *Attorney, Agent, or Firm* — Wolf, Greenfield & Sacks, P.C.; Randy J. Pritzker

(57) ABSTRACT

A semiconductor device includes a wiring substrate, a first semiconductor chip mounted on the wiring substrate, and a second semiconductor chip mounted on the wiring substrate. The second semiconductor chip generates less heat than the first semiconductor chip. A heat dissipation plate is arranged on the wiring substrate and partially at a higher location than the first and second semiconductor chips. The heat dissipation plate is connected to the first semiconductor chip and includes an opening formed at a location corresponding to an upper surface of the second semiconductor chip. The upper surface of the second semiconductor chip is entirely exposed from the heat dissipation plate through the opening.

10 Claims, 7 Drawing Sheets

SEMICONDUCTOR DEVICE

CROSS-REFERENCE TO RELATED APPLICATIONS

This application is based upon and claims the benefit of priority from prior Japanese Patent Application No. 2011-178933, filed on Aug. 18, 2011, the entire contents of which are incorporated herein by reference.

FIELD

The embodiments discussed herein are related to a semiconductor device.

BACKGROUND

Semiconductor devices are required to be compact and sophisticated. A multi-chip package (MCP), which mounts a plurality of semiconductor chips on a substrate, is known as a semiconductor device that satisfies such requirements.

In such a semiconductor device, a heat dissipation component (e.g., metal heat dissipation plate) is arranged on a semiconductor chip to dissipate the heat generated from the semiconductor chip into the environment. This layout ensures and increases the transfer of heat from the semiconductor chip to the exterior of the semiconductor device. A thermal conduction member (thermal interface material: TIM) is arranged between the semiconductor chip and the heat dissipation plate. The thermal conduction member compensates for unevenness in the surfaces of the semiconductor chip and the heat dissipation plate, while decreasing the contact thermal resistance. This smoothly transfers heat from the semiconductor chip to the heat dissipation plate.

FIG. 10 illustrates a prior art example of a semiconductor device 3 that uses a heat dissipation plate. The semiconductor device 3 includes a wiring substrate 60. A first chip 61 and a second chip 62 are arranged next to each other on the wiring substrate 60. The heat dissipation plate 63 is shared by and attached to the first chip 61 and the second chip 62. A thermal conduction member 64 is arranged between the upper surface of the first chip 61 and the lower surface of the heat dissipation plate 63 and between the upper surface of the second chip 62 and the lower surface of the heat dissipation plate 63.

The first chip 61 and second chip 62 generate heat. The thermal conduction member 64 conducts the heat to the heat dissipation plate 63. This suppresses increases in the temperature of the first chip 61 and the second chip 62.

Prior art examples are described in Japanese Laid-Open Patent Publication Nos. 2004-172489 and 2009-43978.

In the semiconductor device 3, a semiconductor element such as a logic element, which has a large thermal resistance and generates a large amount of heat, may be formed on the first chip 61. Further, a semiconductor element such as a memory, which has a small thermal resistance and is vulnerable to heat, may be formed on the second chip 62. In this case, a logic chip, which generates a large amount of heat, is arranged together with a memory chip, which is vulnerable to heat. As described above, the heat generated by the first chip 61 and the second chip 62 is conducted to the same heat dissipation plate 63. The heat dissipation plate 63 conducts the heat generated by the semiconductor chip that generates a large amount of heat (i.e., the first chip 61) to the semiconductor chip that is vulnerable to heat (i.e., second chip 62). When the heat conduction increases the temperature of the second chip 62 to an excessively high temperature, the second chip 62 may fail to function normally. Accordingly, the reliability of the prior art semiconductor device 3 with respect to heat is relatively low.

SUMMARY

One aspect of the embodiments is a semiconductor device including a wiring substrate. A first semiconductor chip is mounted on the wiring substrate. A second semiconductor chip is mounted on the wiring substrate. The second semiconductor chip generates less heat than the first semiconductor chip. A heat dissipation plate is arranged on the wiring substrate and partially at a higher location than the first semiconductor chip and the second semiconductor chip. The heat dissipation plate is connected to the first semiconductor chip. The heat dissipation plate includes an opening formed at a location corresponding to an upper surface of the second semiconductor chip. The upper surface of the second semiconductor chip is entirely exposed from the heat dissipation plate through the opening.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DESCRIPTION OF EMBODIMENTS

Embodiments of a semiconductor device will now be described with reference to the accompanying drawings, which schematically illustrate structures to facilitate understanding and do not depict actual scale.

First Embodiment

Figure 1:
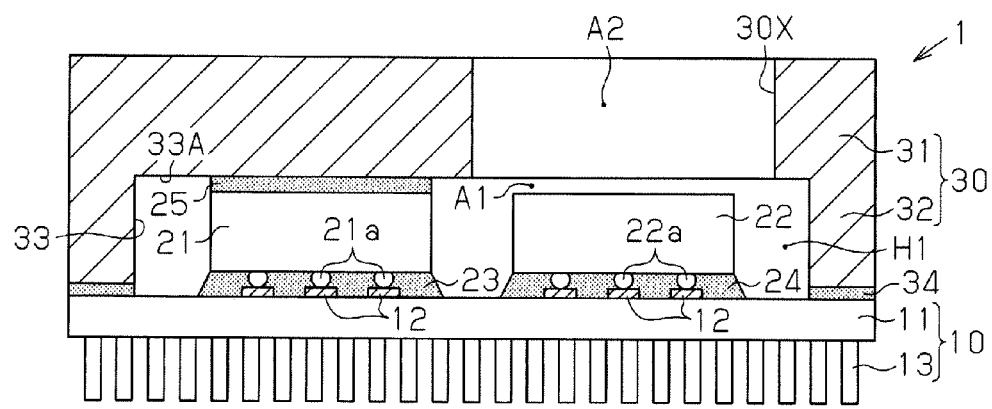
FIG. 1 is a schematic cross-sectional view illustrating a first embodiment of a semiconductor device.

A first embodiment will now be described with reference to FIGS. 1 to 3. Referring to FIG. 1, a semiconductor device 1 includes a pin grid array (PGA) type wiring substrate 10, a first chip 21 (first semiconductor chip), a second chip 22 (second semiconductor chip), and a heat dissipation plate 30. The first chip 21 and the second chip 22 are mounted on the wiring substrate 10 next to each other. The heat dissipation plate 30 is arranged on the first chip 21. In the illustrated example, the first chip 21 and the second chip 22 are arranged next to each other in the horizontal direction and form a planar structure. The first chip 21 is a logic chip that has a high thermal resistance and generates a large amount of heat. The second chip 22 is a memory chip that has a lower thermal resistance than the first chip 21 and is vulnerable to heat. Further, the second chip 22 is a semiconductor chip that generates less heat than the first chip 21. Examples of a logic chip include a central processing unit (CPU) chip and a graphics processing unit (GPU) chip. Examples of a memory chip include a dynamic random access memory (DRAM) chip, a static random access memory (SRAM) chip, and a flash memory chip.

The wiring substrate 10 includes a substrate body 11, connection pads 12 formed on an upper surface of the substrate body 11, and pins formed on a lower surface of the substrate body 11. The substrate body 11 only needs to have a structure that electrically connects the connection pads 12 and the pins 13 through the substrate interior. Thus, a wiring layer does not have to be formed in the substrate body 11. This eliminates the need for a wiring layer. When a wiring layer is formed in the substrate body 11, a plurality of wiring layers are stacked with interlayer insulative layers arranged in between, and the connection pads 12 and pins 13 are electrically connected by vias formed in the wiring layers and resin layers. The substrate body 11 may be a cored build-up substrate, which includes a substrate core, or a coreless substrate, which does not include a substrate core.

The first chip 21 includes a circuit formation surface (lower surface as viewed in FIG. 1). Electrode bumps 21a are formed on the circuit formation surface of the first chip 21 and flip-chip bond to the connection pads 12. Plating, such as nickel plating or gold plating, may be applied to the surface of a copper layer on each connection pad 12. The electrode bumps 21a may be formed by, for example, gold bumps or solder bumps. Solder bumps may be formed from, for example, an alloy including lead (Pb), an alloy of tin (Sn) and copper (Cu), an alloy of Sn and silver (Ag), an alloy of Sn, Ag, and Cu, or the like.

An underfill resin 23 is filled between the lower surface of the first chip 21 and the upper surface of the wiring substrate 10. The underfill resin 23 may be formed from an insulative resin such as an epoxy resin.

The second chip 22, which is separated in the sideward direction from the first chip 21, includes a circuit formation surface (lower surface as viewed in FIG. 1). Electrode bumps 22a are formed on the circuit formation surface of the second chip 22 and flip-chip bond to the connection pads 12. The electrode bumps 22a may be formed by, for example, gold bumps or solder bumps. Solder bumps may be formed from, for example, an alloy including lead (Pb), an alloy of tin (Sn) and copper (Cu), an alloy of Sn and silver (Ag), an alloy of Sn, Ag, and Cu, or the like.

An underfill resin 24 is filled between the lower surface of the second chip 22 and the upper surface of the wiring substrate 10. The underfill resin 24 may be formed from an insulative resin such as an epoxy resin.

The first chip 21 may have a height of, for example, 0.5 to 1 mm. The second chip 22 may have a height that is the same as the first chip 21, less than the first chip 21, or greater than the first chip 21. For example, the second chip 22 may have a height of 0.3 to 5 mm.

The semiconductor device 1 is required to have a bandwidth between the first chip 21 (logic chip) and the second chip 22 (memory chip). To obtain easily the bandwidth, it is preferred that the first chip 21 be arranged near the second chip 22. In a non-restrictive example, the first chip 21 and the second chip 22 are spaced apart by a distance of approximately 2 to 3 mm.

The heat dissipation plate 30 is arranged at a higher location than the first chip 21 and the second chip 22. The heat dissipation plate 30 is also referred to as a heat spreader. The heat dissipation plate 30 may be formed from, for example, copper, silver, aluminum, an alloy of these metals, or the like.

The heat dissipation plate 30 is bonded to the wiring substrate 10. More specifically, a bonding member 34 bonds the heat dissipation plate 30 onto a peripheral portion of the wiring substrate 10 around the first chip 21 and the second chip 22. The bonding member 34 may be formed from, for example, a silicon polymer resin.

The heat dissipation plate 30 includes a planar portion 31 and a frame-shaped wall portion 32, which is formed integrally with the planar portion 31. The wall portion 32 includes a bottom surface bonded by the bonding member 34 to the wiring substrate 10. The planar portion 31 and the wall portion 32 form a hollow portion 33 in the heat dissipation plate 30. The hollow portion 33 and the wiring substrate 10 form an accommodation portion H1, which accommodates the first chip 21 and the second chip 22. A thermal conduction member 25 (TIM) thermally couples a surface of the first chip 21 opposite to the circuit formation surface (upper surface in FIG. 1) to an end surface 33A of the hollow portion 33 in the heat dissipation plate 30. The thermal conduction member 25 dissipates the heat generated from the first chip 21 to the heat dissipation plate 30. The planar portion 31 of the heat dissipation plate 30 may have a thickness of, for example, approximately 0.5 to 4 mm. The thermal conduction member 25 may be formed with a resin binder as a film of a high thermal conductance substance such as indium (In), silicone (or hydrocarbon) grease, a metal filler, or graphite. The thermal conduction member 25 has a thickness of, for example, 20 to 30 μm.

Figure 2:
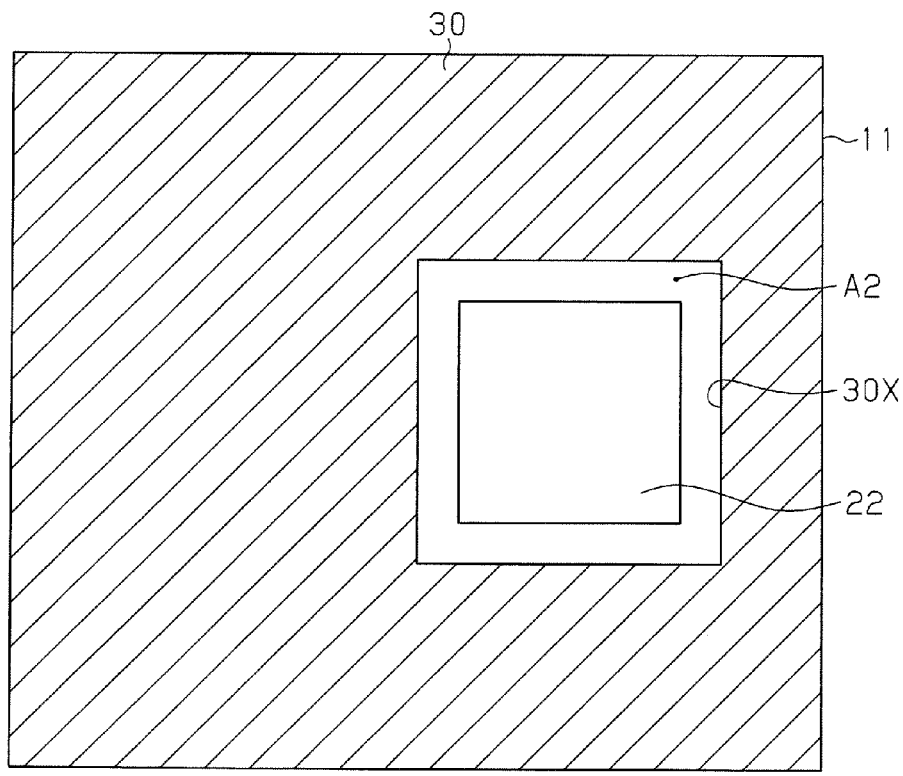
FIG. 2 is a schematic plan view illustrating the semiconductor device of FIG. 1.

Referring to the plan view of FIG. 2, the heat dissipation plate 30 includes an opening 30X, which is formed at a location corresponding to an upper surface of the second chip 22. The opening 30X is larger than the second chip 22. In the illustrated example, the opening 30X has a shape (e.g., tetragonal shape) corresponding to the second chip 22. Further, the opening 30X has a larger area than the second chip 22 as viewed from above. In the illustrated example, the opening 30X is a through hole. FIG. 2 illustrates an upper side of the second chip 22 that forms a space A1 (air) and a space A2 (air). The space A1 is formed between the lower end of the opening 30X and the upper surface of the second chip 22. The space A2 is formed in the opening 30X. The spaces A1 and A2 dissipate the heat generated by the second chip 22 to the environment. Further, the spaces A1 and A2 separate the second chip 22 from the heat dissipation plate 30. The spaces A1 and A2 function as a heat dissipation passage for the heat generated from the second chip 22. In addition, the spaces A1 and A2 also function as a thermal insulator that suppresses the conduction of heat from the heat dissipation plate 20 to the second chip 22. The spaces A1 and A2 may be referred to as an air passage or a fluid air layer.

The heat dissipation plate 30 is manufactured through, for example, a forging process or a machining process.

Operation

In the semiconductor device 3, the first chip 21 generates a large amount of heat. The thermal conduction member 25 conducts the heat generated by the first chip 21 to the heat dissipation plate 30. Here, the heat dissipation plate 30 includes an opening 30X located at a position opposing the second chip 22 to expose the entire upper surface of the second chip 22. Further, the space A1 (gap) is formed between the opening 30X and the second chip 22. The spaces A1 and A2 function as a thermal insulator between the second chip 22 and the heat dissipation plate 30. Thus, there is no thermal coupler that contacts the second chip 22 and the heat dissipation plate 30. This suppresses the conduction of heat from the first chip 21 to the second chip 22 through the heat dissipation plate 30.

The present embodiment has the advantages described below.

(1) The opening 30X, which exposes the entire upper surface of the second chip 22 that is vulnerable to heat, is formed in the heat dissipation plate 30 at a location corresponding to the second chip 22. The space A2 in the opening 30X blocks the conduction of heat from the first chip 21 to the second chip 22 through the heat dissipation plate 30. This reduces the effect of the heat from the first chip 21 on the second chip 22, and the heat of the first chip 21 does not increase the temperature of the second chip 22. Accordingly, the occurrence of a problem such as the second chip 22 failing to function normally due to high temperatures is suppressed. As a result, the reliability of the semiconductor device 1 with respect to heat is improved.

(2) The heat dissipation plate 30 includes the opening 30X (space A2). Thus, for example, as illustrated in FIG. 3, when the second chip 22 has a greater height than the first chip 21, the second chip 22 is put in the opening 30X. This eliminates the need to change the shape of the heat dissipation plate 30 in accordance with the height difference of the first chip 21 and the second chip 22 even when the first chip 21 and the second chip 22 have different heights. Further, there is no need to form a stepped portion in the end surface 33A of the hollow portion 33 in the heat dissipation plate 30 in accordance with the difference in the shapes of the first chip 21 and the second chip 22. This facilitates the manufacturing of the heat dissipation plate 30.

Figure 3:
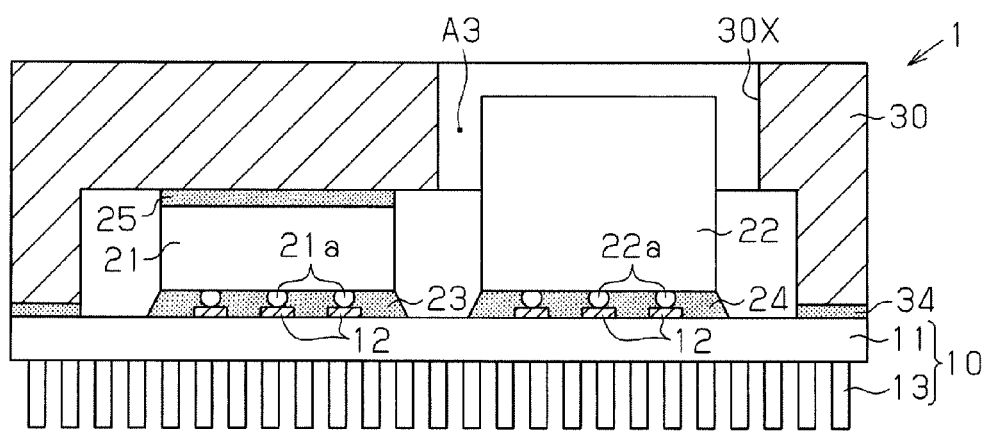
FIG. 3 is a schematic cross-sectional view illustrating a first modified example of the semiconductor device of FIG. 1.

As illustrated in FIG. 3, even when the second chip 22 has a height that results in part of the second chip 22 being put in the opening 30X, the opening 30X is larger than the second chip 22. Thus, the second chip 22 does not contact the heat dissipation plate 30, and a space A3 is formed between the side walls of the second chip 22 and the heat dissipation plate 30. The air of the space A3 suppresses the conduction of heat from the first chip 21 to the second chip 22 through the heat dissipation plate 30.

Modified Examples of First Embodiment

The first embodiment may be modified as described below.

Figure 4A:
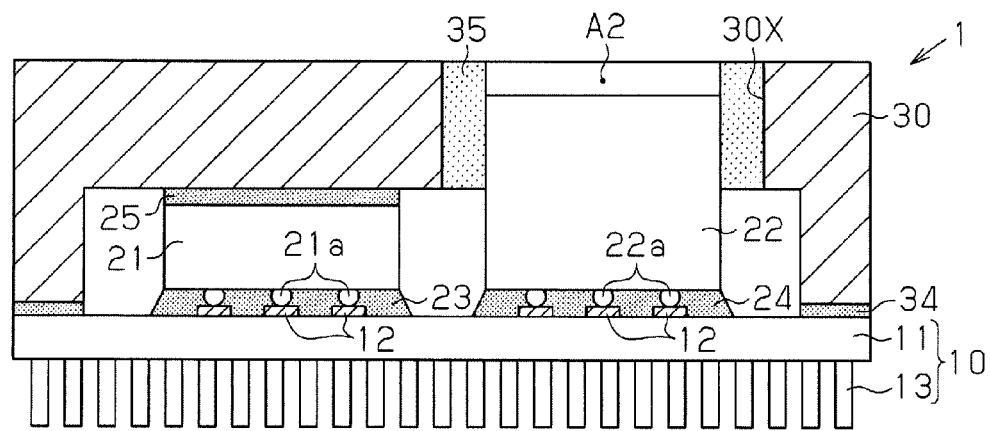
FIG. 4A is a schematic cross-sectional view and FIG. 4B is a schematic plan view illustrating a second modified example of the semiconductor device of FIG. 1.
Figure 4B:
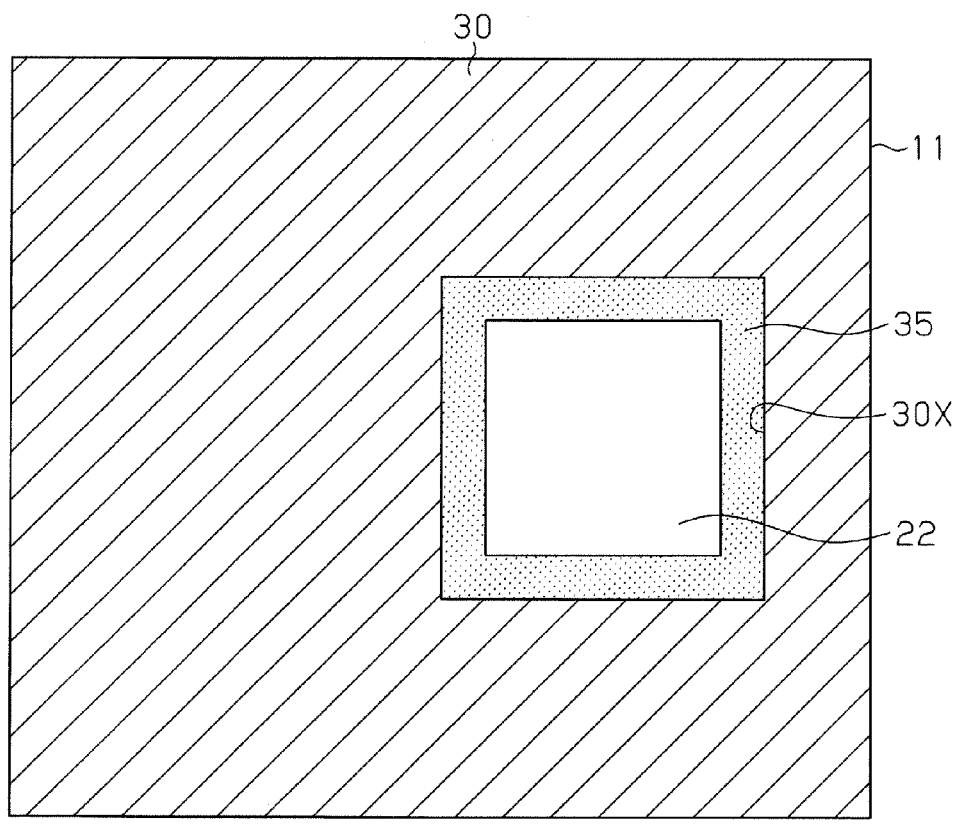

Referring to FIG. 4, when the second chip 22 has a height that results in part of the second chip being put in the opening 30X of the heat dissipation plate 30, a thermal insulation resin 35 may be arranged on the wall defining the opening 30X. In the example illustrated in FIGS. 4A and 4B, the thermal insulation resin 35 is arranged between the wall of the opening 30X and the second chip 22. A porous resin, such as a sponge like urethane resin, may be used as the thermal insulation resin 35. Further, the thermal insulation resin 35 may be a paste or film of resin. The thermal insulation resin 35 is adhered to the wall of the opening 30X by an adhesive agent or the like.

The thermal insulation resin 35 has a higher thermal insulation capability than the air of the space A3. Accordingly, the thermal insulation resin 35 arranged between the wall of the opening 30X and the second chip 22 suppresses the conduction of heat from the heat dissipation plate 30 to the second chip 22 in a preferred manner.

Figure 5:
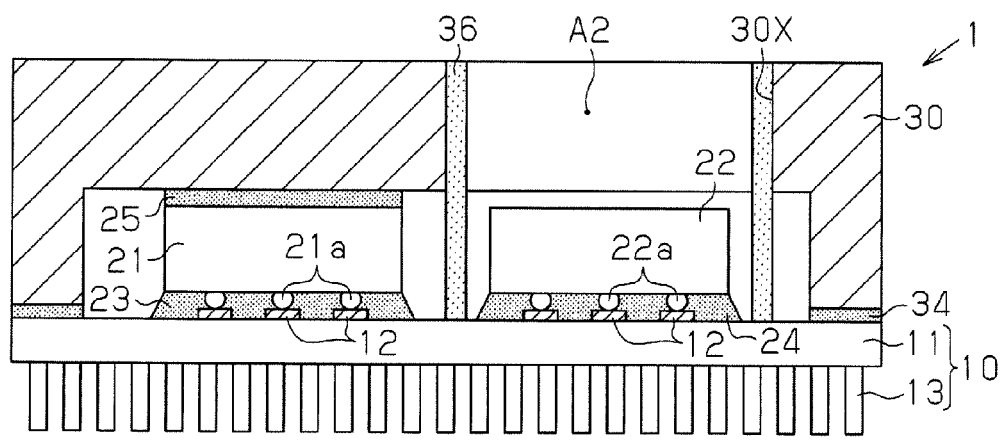
FIG. 5 is a schematic cross-sectional view illustrating a third modified example of the semiconductor device of FIG. 1.

Referring to FIG. 5, a thermal insulation resin 36 may be arranged on the wiring substrate 10 between the first chip 21 and the second chip 22. The thermal insulation resin 36 partitions the accommodation portion H1, which is defined by the heat dissipation plate 30 and the wiring substrate 10, into a compartment corresponding to the first chip 21 and a compartment corresponding to the second chip 22. This decreases the transfer of heat through the space between the first chip 21 and the second chip 22. Preferably, the thermal insulation resin 36 thermally isolates the first chip 21 and the second chip 22. In FIG. 5, the thermal insulation resin 36 is formed to cover entirely the wall of the opening 30X and to surround the second chip 22 and the underfill resin 24. A porous resin, such as a sponge like urethane resin, may be used as the thermal insulation resin 36. Further, plates of resin arranged at four sides surrounding the second chip 22 and the underfill resin 24 may be used as the thermal insulation resin 36. Alternatively, a tetragonal tube of resin surrounding the second chip 22 and the underfill resin 24 may be used as the thermal insulation resin 36. The thermal insulation resin 36 is adhered by, for example, an adhesive agent to the upper surface of the wiring substrate 10 and to the wall of the opening 30X.

In this manner, the arrangement of the thermal insulation resin 36 between the first chip 21 and the second chip 22 blocks the transfer of heat from the first chip 21, which generates a large amount of heat, to the second chip 22 through the space in the horizontal direction (sideward direction) in an optimal manner. The layout of the thermal insulation resin 36 between at least the first chip 21 and the second chip 22 obtains the same advantages as those described above. Thus, the thermal insulation resin 36 does not have to surround the entire second chip 22.

Second Embodiment

A second embodiment will now be described with reference to FIG. 6. Like or same reference numerals are given to those components that are the same or similar in FIGS. 1 to 5. Such components will not be described in detail.

Figure 6A:
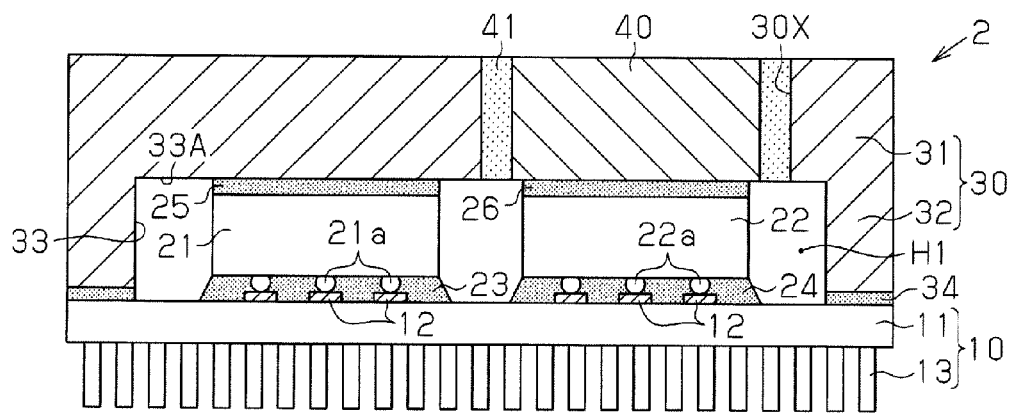
FIG. 6A is a schematic cross-sectional view and FIG. 6B is a schematic plan view illustrating a second embodiment of a semiconductor device.

As illustrated in FIG. 6A, a semiconductor device 2 includes a pin grid array (PGA) type wiring substrate 10, a first chip 21, a second chip 22, a heat dissipation plate 30, a heat dissipation plate 40, and a thermal insulation resin 41. The first chip 21 and the second chip 22 are mounted on the wiring substrate 10 next to each other. The heat dissipation plate 30 is arranged on the first chip 21. The heat dissipation plate 40 is arranged on the second chip 22. The thermal insulation resin 41 is arranged between the heat dissipation plates 30 and 40.

A thermal conduction member 25 thermally couples the upper surface of the first chip 21 to an end surface 33A of a hollow portion 33 in the heat dissipation plate 30 (first heat dissipation plate). The heat dissipation plate 30 includes an opening 30X at a location opposing the second chip 22. The opening 30X is larger than the second chip 22 as viewed from above.

A thermal conduction member 26 thermally couples the upper surface of the second chip 22 to a bottom surface of the heat dissipation plate 40 (second heat dissipation plate). The heat dissipation plate 40, which is planar, is arranged in the opening 30X of the heat dissipation plate 30 and separated from the heat dissipation plate 30. The heat dissipation plate 40 may be formed from, for example, copper, silver, aluminum, an alloy of these metals, or the like. The thermal conduction member 26 may be formed with a resin binder as a film of a high thermal conductance substance such as indium, silicone (or hydrocarbon) grease, a metal filler, or graphite.

Figure 6B:
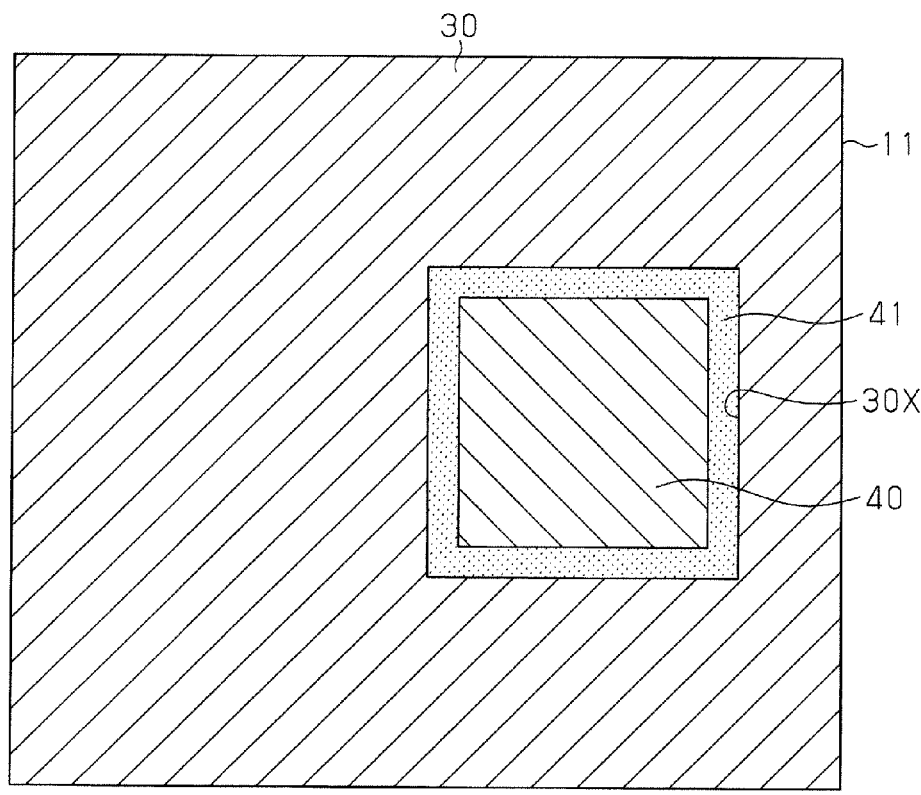

As illustrated in FIG. 6B, the thermal insulation resin 41 is arranged between the heat dissipation plate 40 and the wall defining the opening 30X of the heat dissipation plate 30. A porous resin, such as a sponge like urethane resin, may be used as the thermal insulation resin 41. Further, the thermal insulation resin 41 may be a paste or film of resin. The thermal insulation resin 41 is adhered to the wall of the opening 30X by an adhesive agent or the like.

In this manner, in the present embodiment, the first chip 21 is thermally coupled to the heat dissipation plate 30 in an independent manner, and the second chip 22 is thermally coupled to the heat dissipation plate 40 in an independent manner. The heat dissipation plate 30 and the heat dissipation plate 40 are separated from each other. The heat generated by the first chip 21 is dissipated to the heat dissipation plate 30, and the heat generated by the second chip 22 is dissipated to the heat dissipation plate 40. In this manner, in the semiconductor device 2 of the present embodiment, the heat dissipation passage of the first chip 21 is separated from the heat dissipation passage of the second chip 22. Further, the thermal insulation resin 41 is arranged between the heat dissipation plates 30 and 40, which form heat dissipation passages. The thermal insulation resin 41 blocks the conduction of heat from the first chip 21 to the second chip 22 through the heat dissipation plate 30 in an optimal manner.

The present embodiment has the advantages described below.

(1) The heat dissipation passage of the first chip 21 is separated from the heat dissipation passage of the second chip 22, and the thermal insulation resin 41 is arranged between the heat dissipation plates 30 and 40, which form the heat dissipation passages of the first and second chips 21 and 22. This suppresses the conduction of heat from the first chip 21 to the second chip 22 through the heat dissipation plate 30 in an optimal manner. Accordingly, the heat of the first chip 21 does not increase the temperature of the second chip 22. This suppresses the occurrence of a problem such as the second chip 22 failing to function normally due to high temperatures. As a result, the reliability of the semiconductor device 1 with respect to heat is improved.

(2) The first chip 21 is thermally coupled to the heat dissipation plate 30. Thus, the heat generated from the first chip 21 is transferred to the heat dissipation plate 30. This efficiently dissipates heat from the first chip 21 and suppresses increases in the temperature of the first chip 21. Further, the second chip 22 is thermally coupled to the heat dissipation plate 40. Thus, the heat generated from the second chip 22 is transferred to the heat dissipation plate 40. This efficiently dissipates heat from the second chip 22 and suppresses increases in the temperature of the second chip 22.

Modified Examples of Second Embodiment

The second embodiment may be modified as described below.

Figure 7:
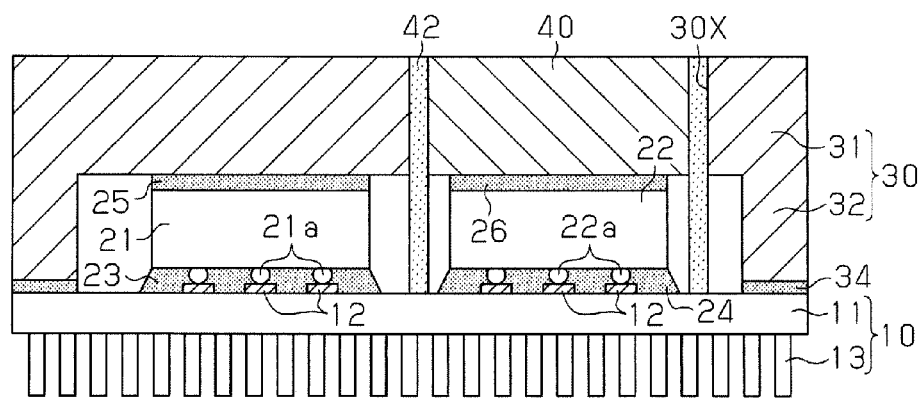
FIG. 7 is a schematic cross-sectional view illustrating a modified example of the semiconductor device of FIG. 6A.

Referring to FIG. 7, a thermal insulation resin 42, which is formed between the heat dissipation plate 40 and the wall defining the opening 30X of the heat dissipation plate 30, may extend from the wiring substrate 10 between the first chip 21 and the second chip 22. The thermal insulation resin 42 partitions the accommodation portion H1 (refer to FIG. 1), which is defined by the heat dissipation plate 30 and the wiring substrate 10, into a compartment corresponding to the first chip 21 and a compartment corresponding to the second chip 22. This decreases the transfer of heat through the space between the first chip 21 and the second chip 22. Preferably, the thermal insulation resin 42 thermally isolates the first chip 21 and the second chip 22. The thermal insulation resin 42 is formed around the second chip 22 and the underfill resin 24.

The thermal insulation resin 42 is adhered by, for example, an adhesive agent to the upper surface of the wiring substrate 10 and to the wall of the opening 30X.

In this manner, the arrangement of the thermal insulation resin 42 between the first chip 21 and the second chip 22 blocks the transfer of heat from the first chip 21, which generates a large amount of heat, to the second chip 22 through space in the horizontal direction (sideward direction) in an optimal manner.

It should be apparent to those skilled in the art that the present invention may be embodied in many other specific forms without departing from the spirit or scope of the invention. Particularly, it should be understood that the present invention may be embodied in the following forms.

Figure 8:
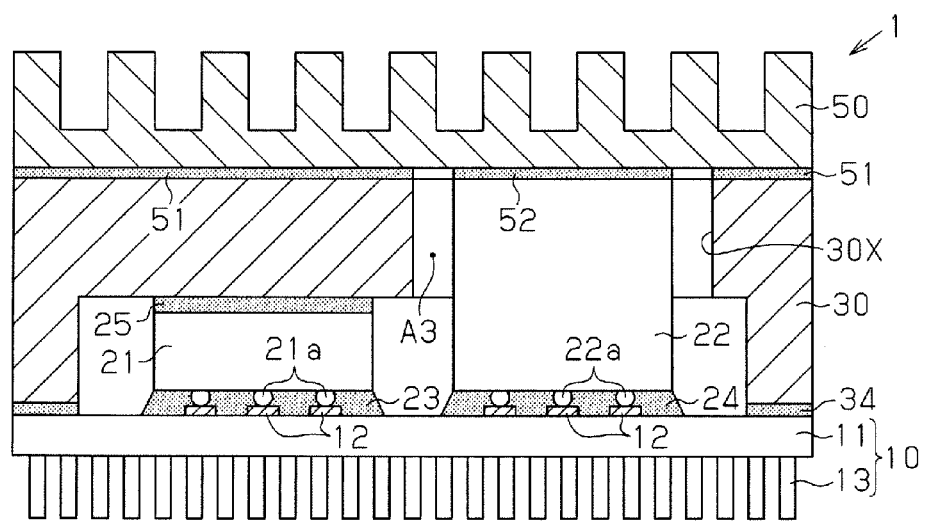
FIG. 8 is a schematic cross-sectional view illustrating a fourth modified example of the semiconductor device of FIG. 1.

In the above embodiments, heat dissipation fins may be arranged above the heat dissipation plate 30. The heat dissipation fins may be, for example, directly connected or indirectly connected by a thermal conduction structure to the upper surface of the heat dissipation plate 30. FIG. 8 illustrates a modified example of the first embodiment. As illustrated in FIG. 8, heat dissipation fins 50 are arranged on, for example, an upper surface of a thermal conduction member 51, which is arranged on the upper surface of the heat dissipation plate 30. The thermal conduction member 51 thermally couples the heat dissipation plate 30 and the heat dissipation fins 50. Thus, the heat generated from the first chip 21 is first transferred to the heat dissipation plate 30. Then, the thermal conduction member 51 conducts the heat to the heat dissipation fins 50, which transfer the heat to the environment (typically air). In this case, a thermal conduction member 52 may thermally couple the upper surface of the second chip 22 to the heat dissipation fins 50. This transfers the heat generated by the second chip 22 from the heat dissipation fins 50 to the environment. In this case, the heat transfer passage of the first chip 21 is connected by the heat dissipation fins 50 to the heat transfer passage of the second chip 22. The heat generated from the first chip 21 is first transferred to the heat dissipation plate 30 and then conducted to the heat dissipation fins 50. Thus, the amount of heat transferred from the heat dissipation fins 50 to the second chip 22 is smaller than when the heat dissipation plate 30 and the second chip 22 are thermally coupled. Thus, an increase in the temperature of the second chip 22 caused by the heat from the first chip 21 is suppressed even in such a structure. Further, the thermal coupling of the second chip 22 and the heat dissipation fins 50 efficiently dissipates the heat generated from the second chip 22.

In the semiconductor device 2 of the second embodiment, the heat dissipation fins 50 may also be arranged above the heat dissipation plates 30 and 40.

The heat dissipation fins 50 may be formed, for example, by applying nickel plating to an oxygen-free copper or from a material having a high thermal conductance, such as aluminum. A different cooling or heat dissipation portion (e.g., heat pipe or vapor chamber) may be provided in lieu of the heat dissipation fins 50. Further, plural types of cooling or heat dissipation portions, such as heat pipes and vapor chambers may be arranged between the heat dissipation plate 30 and the heat dissipation fins 50.

Figure 9:
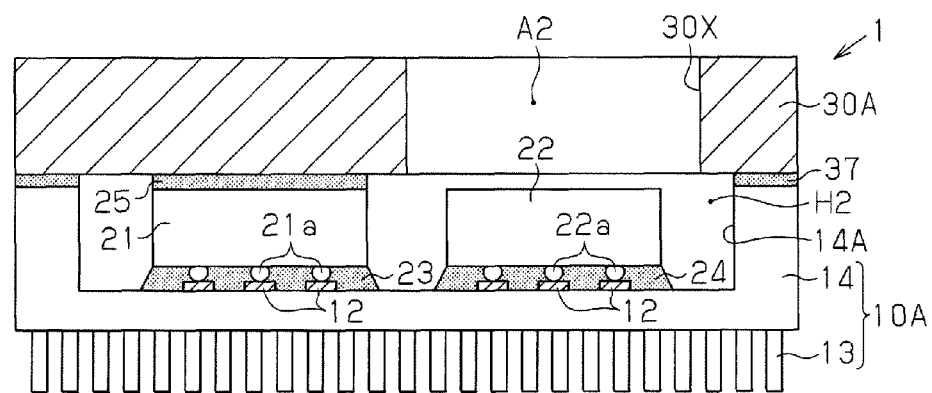
FIG. 9 is a schematic cross-sectional view illustrating a fourth modified example of the semiconductor device of FIG. 1.
Figure 10:
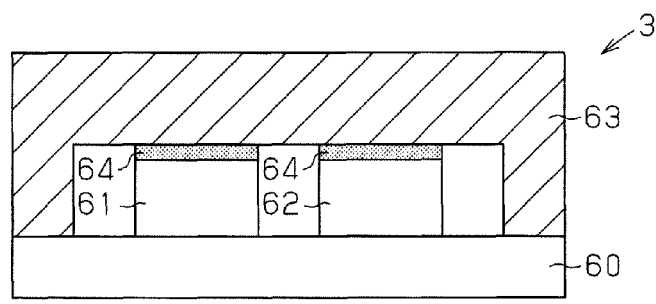
FIG. 10 is a schematic cross-sectional view illustrating a semiconductor device of the prior art.

In each of the above embodiments, the heat dissipation plate 30, which includes the hollow portion 33, is bonded to the wiring substrate 10. Further, the wiring substrate 10 and heat dissipation plate 30 form the accommodation portion H1 that accommodates the first chip 21 and the second chip 22. However, the present invention is not limited to such a structure. For example, as illustrated in FIG. 9, a wiring substrate 10A including a substrate body 14 may have a hollow portion 14A provided with a mounting surface on which the first chip 21 and the second chip 22 are arranged. A planar heat dissipation plate 30A may be bonded to a peripheral portion of the substrate body 14 so that the substrate body 14 and the heat dissipation plate 30A form an accommodation portion H2 that accommodates the first chip 21 and the second chip 22. A bonding member 37 bonds the wiring substrate 10A and the heat dissipation plate 30A. The bonding member 37 may be formed from, for example, a silicon polymer resin.

FIG. 9 illustrates a modified example of the semiconductor device 1 of the first embodiment. However, the semiconductor device 3 of the second embodiment may be modified in the same manner.

Each of the above embodiments is applied to a PGA type wiring substrate 10 but may also be applied to, for example, a land grid array (LGA) type wiring substrate or a ball grid array type wiring substrate.

In each of the above embodiments, the first chip 21 and the second chip 22 are flip-chip mounted on the wiring substrate 10. However, the first chip 21 and the second chip 22 may be, for example, mounted on the wiring substrate 10 through wire bonding. Further, flip-chip mounting and wire bonding mounting may both be performed.

In each of the above embodiments, two semiconductor chips are mounted on the wiring substrate 10. However, for example, three or more semiconductor chips may be mounted on the wiring substrate 10.

The present examples and embodiments are to be considered as illustrative and not restrictive, and the invention is not to be limited to the details given herein, but may be modified within the scope and equivalence of the appended claims.

The invention claimed is:

1. A semiconductor device comprising:
   a wiring substrate;
   a first semiconductor chip mounted on the wiring substrate;
   a second semiconductor chip mounted on the wiring substrate, wherein the second semiconductor chip generates less heat than the first semiconductor chip; and
   a heat dissipation plate arranged on the wiring substrate and partially at a higher location than the first semiconductor chip and the second semiconductor chip, wherein
   the heat dissipation plate is connected to the first semiconductor chip,
   the heat dissipation plate includes an opening formed at a location corresponding to an upper surface of the second semiconductor chip, and
   the upper surface of the second semiconductor chip is entirely exposed from the heat dissipation plate through the opening.

2. The semiconductor device according to claim 1, wherein the second semiconductor chip is put in the opening, and the semiconductor device further comprises a thermal insulation resin formed between the second semiconductor chip and a wall defining the opening.

3. The semiconductor device according to claim 1, further comprising a thermal insulation resin arranged on the wiring substrate between the first semiconductor chip and the second semiconductor chip.

4. The semiconductor device according to claim 2, further comprising a thermal insulation resin arranged on the wiring substrate between the first semiconductor chip and the second semiconductor chip.

5. The semiconductor device according to claim 1, wherein the second semiconductor chip is free from contact with a wall defining the opening.

6. The semiconductor device according to claim 5, wherein an air passage is formed between the second semiconductor chip and the wall defining the opening.

7. The semiconductor device according to claim 5, wherein a thermal insulation resin is formed between the second semiconductor chip and the wall defining the opening.

8. The semiconductor device according to claim 1, further comprising a heat dissipation portion arranged on the heat dissipation plate and connected to the heat dissipation plate and the second semiconductor chip.

9. A semiconductor device comprising:
   a wiring substrate;
   a first semiconductor chip mounted on the wiring substrate;
   a second semiconductor chip mounted on the wiring substrate, wherein the second semiconductor chip generates less heat than the first semiconductor chip;
   a first heat dissipation plate arranged on the wiring substrate and partially at a higher location than the first semiconductor chip and the second semiconductor chip, wherein the first heat dissipation plate is connected to the first semiconductor chip and includes an opening formed at a location corresponding to an upper surface of the second semiconductor chip;
   a second heat dissipation plate arranged in the opening and connected to the second semiconductor chip; and
   a thermal insulation resin formed between the second heat dissipation plate and a wall defining the opening.

10. The semiconductor device according to claim 9, wherein the thermal insulation resin is arranged on the wiring substrate between the first semiconductor chip and the second semiconductor chip.

* * * * *